(12) United States Patent
Li et al.

(10) Patent No.: US 7,271,098 B2
(45) Date of Patent: Sep. 18, 2007

(54) METHOD OF FABRICATING A DESIRED PATTERN OF ELECTRONICALLY FUNCTIONAL MATERIAL

(75) Inventors: Shunpu Li, Cambridge (GB); Christopher Newsome, Cambridge (GB); Thomas Kugler, Cambridge (GB); David Russell, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 324 days.

(21) Appl. No.: 11/102,711

(22) Filed: Apr. 11, 2005

(65) Prior Publication Data

US 2005/0250244 A1 Nov. 10, 2005

(30) Foreign Application Priority Data

May 7, 2000 (GB) ................................. 0410236.4

(51) Int. Cl.
H01L 21/302 (2006.01)
(52) U.S. Cl. .................. 438/689; 438/99; 438/479; 438/608; 438/694; 257/E21.038; 257/E21.257
(58) Field of Classification Search ............. 438/99, 438/479, 608, 694
See application file for complete search history.

(56) References Cited

U.S. PATENT DOCUMENTS

| | | | | |
|---|---|---|---|---|
| 5,132,248 A | * | 7/1992 | Drummond et al. | ........ 505/325 |
| 6,309,691 B1 | | 10/2001 | Hasegawa | |
| 6,685,982 B2 | | 2/2004 | Hasegawa | |
| 6,821,551 B2 | | 11/2004 | Hasegawa | |
| 2003/0211643 A1 | | 11/2003 | Fujimori et al. | |

FOREIGN PATENT DOCUMENTS

| | | |
|---|---|---|
| EP | 1 003 078 A2 | 5/2000 |
| EP | 1 345 261 A1 | 9/2003 |
| GB | 2 373 095 A | 9/2002 |
| JP | A-2003-509869 | 3/2003 |
| JP | A-2004-31933 | 1/2004 |
| KR | 10-0270497 | 9/1997 |
| WO | WO 01/20691 A1 | 3/2001 |
| WO | WO 03/073164 | 9/2003 |
| WO | WO 2004/013922 A2 | 2/2004 |

OTHER PUBLICATIONS

Marcus Halik et al., "Fully patterned all-organic thin film transistors," Applied Physics Letters, vol. 81, No. 2 American Institute of Physics, pp. 289-291, Jul. 8, 2002.

* cited by examiner

Primary Examiner—Michael Lebentritt
Assistant Examiner—Kyoung Lee
(74) Attorney, Agent, or Firm—Oliff & Berridge PLC

(57) ABSTRACT

Provided is a method forming a desired pattern of electronically functional material 3 on a substrate 1. The method comprises the steps of: creating a first layer of patterning material 2 on the substrate whilst leaving areas of the substrate exposed to define said desired pattern; printing a suspension comprising particles of the electronically functional material 3 in a liquid dispersant, to which the patterning material is impervious, on the patterning material and the exposed substrate; removing at least some of the liquid dispersant from the suspension to consolidate the particles; and applying a first solvent to said consolidated particles which is capable of solubilizing the patterning material 2 and to which the consolidated particles are pervious so that the patterning material is removed from the substrate 1 together with any overlying electronically functional material 3.

28 Claims, 3 Drawing Sheets

METHOD OF FABRICATING A DESIRED PATTERN OF ELECTRONICALLY FUNCTIONAL MATERIAL

This invention relates to a method of fabricating a desired pattern of electronically functional material on a substrate, and is applicable to the fabrication of thin film transistors incorporating such patterns of electronically functional material.

Currently, electronically functional materials are predominantly patterned using photolithography. This technique allows very high-resolution components to be formed on a substrate. The main disadvantages of photolithography are that it is expensive in terms of equipment, requires numerous processing steps and requires large amounts of raw materials, since it is a subtractive technology.

It is known in the art to fabricate electronic devices on a substrate by deposition of material by printing. To reduce processing costs, these methods are now being developed further, one of which is Epson's micro-liquid technology. Since deposition by printing is additive in nature, it requires less electronically functional material and fewer processing steps than photolithographic techniques. However, micro-liquid technology has up to the present time suffered from two main disadvantages as compared with photolithography. Firstly, the achievable resolution in free-format micro-liquid technology has been inferior to the resolution achievable by photolithography. Secondly, it may be difficult to provide ink formulations such that accurate projection thereof from a printing head is satisfactorily achieved, yet electronic performance of the resultant material after deposition and drying of the ink is adequately high for the fabrication of electronic components, such as thin film transistors.

An object of the invention is to provide a patterning method which reduces the need for photolithographic techniques, but which retains the latter's capability for high resolution.

Another object of the invention is to provide a patterning method employing a printing technique which avoids the need to optimize ink formulations for accurate deposition, thereby allowing the ink formulation to be optimized for electronic performance of the resultant material.

In its broadest aspect, the invention provides a method of forming a desired pattern of electronically functional material on a substrate comprising the steps of: creating a first layer of patterning material on the substrate whilst leaving areas of the substrate exposed to define said desired pattern; printing a suspension comprising particles of the electronically functional material in a liquid dispersant, to which the patterning material is impervious, on the patterning material and the exposed substrate; removing at least some of the liquid dispersant from the suspension to consolidate the particles; and applying a first solvent to said consolidated particles which is capable of solubilizing the patterning material and to which the consolidated particles are pervious so that the patterning material is removed from the substrate together with any overlying electronically functional material.

The use of a first solvent to solubilize and remove the patterning material and any overlying electronically functional material allows the pattern of remaining electronically functional material to have been defined as accurately as if it had been deposited, or otherwise defined, by a high-resolution technique such as photolithography.

Furthermore, since printing techniques may more accurately deposit electronically functional material compared with techniques such as spin-coating or dip-coating, which are used in conventional photolithography, less electronically functional material is wasted during the removal step. This advantage is still apparent despite printing techniques not in themselves being accurate enough to deposit electronically functional material directly as a desired pattern to a sufficiently high resolution.

"Printing" in this specification means "ink-jet printing" or "pad-printing" or any other technique capable of depositing a layer of material in a controlled manner to produce a desired pattern on pre-determined, selected areas of a substrate. "Ink-jet printing" means depositing a fluid, including a suspension, on a substrate from a printing head in the form of microscopic liquid droplets.

The patterning material may be a photoresist and the desired pattern may be formed by depositing a layer of the photoresist and subsequently removing selected portions of the photoresist by photolithography to create the first layer. Photolithography is a high-resolution technique which allows the resultant pattern of electronically functional material, after solubilizing and removing the photoresist, to be defined accurately.

The patterning material may alternatively be deposited by laser transfer technology by a method-analogous to thermal transfer printing.

The patterning material may also be a thermoplastic polymer and the desired pattern may be formed by depositing a layer of the thermoplastic polymer and subsequently micro-embossing this to create the first layer. The thermoplastic polymer may be micro-embossed at an elevated temperature, that is, in a liquid state. Micro-embossing is also a high-resolution technique.

The thermoplastic polymer may be polymethylmethacrylate, which is particularly suited for patterning by micro-embossing.

The suspension of electronically functional material may be colloidal. Colloids are particularly suited to the fabrication of patterns of electronically functional material. The average size of the particles of the electronically functional material in the suspension is preferably 0.01-1 µm.

The suspension may be printed by projection in the form of liquid droplets (ink-jet printing). This method of printing may be carried out quickly by conventional ink-jet printing techniques.

The printed suspension may be dried in a drying step to remove at least some of the liquid dispersant. Drying may be carried out at room temperature or accelerated drying may be carried out by heating by thermal contact, by microwave irradiation, by incident infra-red radiation or by subjecting the printed suspension to a lower pressure than atmospheric pressure. Any of these methods can be used to remove at least some of the liquid dispersant and use of one of the accelerated drying methods reduces the time taken to consolidate the particles effectively.

The liquid dispersant may be water, which is a freely available and effective liquid dispersant for many kinds of particles of electronically functional material.

The first solvent may be an organic solvent, such as an ether or a ketone. Particularly preferred is acetone, which is an inexpensive and effective solvent for solubilizing many different types of patterning material.

The electronically functional material may be an electrical insulator, for example silicon dioxide, mica, latex or dielectric polymer particles. Any one of these materials is suitable for forming the insulating components of, for example, thin film transistors.

The electronically functional material may be a semiconductor, for example carbon nanotubes, compound semiconductors such as cadmium selenide, flakes of layered transition metal dichalcogenides, pentacene particles or organic semiconducting polymer particles. The organic semiconductor polymer particles may be poly-3-hexylthiophene. Any of these materials are suitable for forming semiconducting components of, for example, thin film transistors.

The electronically functional material may be an electrical conductor, for example a metal, indium tin oxide, tin oxide, a polythiophene, polyaniline or polypyrrole. The polythiophene may be poly(3,4-ethylenedioxythiophene)-polystyrenesulphonic acid. Any of these materials are suitable for forming components of, for example, thin film transistors.

When the electronically functional material is poly(3,4-ethylenedioxythiophene)-polystyrenesulphonic acid, the consolidated particles may be treated with D-sorbitol dissolved in N-methylpyrrolidone and isopropanol after the first solvent is applied. This treatment enhances the electrical conductance of the resultant pattern of poly(3,4-ethylenedioxythiophene)-polystyrenesulphonic acid.

When the electronically functional material is poly(3,4-ethylenedioxythiophene)-polystyrenesulphonic acid, the consolidated particles may be treated with a second solvent, containing a cross-linking agent such as Silquest®, after the first solvent has been applied. This treatment method improves the mechanical properties of the poly(3,4-ethylenedioxythiophene)-polystyrenesulphonic acid.

The consolidated particles, when formed from poly(3,4-ethylenedioxythiophene)-polystyrenesulphonic acid, may be annealed so as to smooth the surface of the pattern of the electronically functional material after the consolidated particles have been treated. Annealing removes residual solvent from the consolidated particles, which results in a more compact morphology and an increased electrical conductivity.

If the electronically functional material is a conductor, then the desired pattern preferably takes the form of source and drain electrodes in the fabrication of field effect transistors, the fabrication process including the steps of depositing a layer of semiconductor in electrical contact with the source electrode and the drain electrode, depositing a layer of insulator over the layer of semiconductor and providing a gate electrode on the layer of insulator. Such a field effect transistor can be fabricated quickly and accurately.

The field effect transistor may be fabricated by depositing a desired pattern of the insulator in the manner previously described and/or by depositing a desired pattern of the semiconductor in the manner previously described. In this way, the semiconductor and/or insulator may be deposited as accurately as the source and drain electrodes.

The layer of semiconductor may be formed from an organic semiconducting polymer, such as poly-3-hexylthiophene which may be deposited by projection in the form of liquid droplets (ink-jet printing) or by pad-printing; the layer of insulator may be formed from polymethylmethacrylate, which may be deposited by projection in the form of liquid droplets or by pad-printing; and the gate electrode may be formed from poly(3,4-ethylenedioxythiophene)-polystyrenesulphonic acid, which may be deposited by projection in the form of liquid droplets or by pad-printing. Each of these materials, and the deposition method, serves their purpose well for the accurate fabrication of field effect transistors. However, any deposition method may be used for each material.

An array of field effect transistors may be fabricated on a common substrate, wherein the semiconductor layers are each deposited by projection in the form of liquid droplets or by pad-printing. Use of an accurate printing technique such as projection in the form of liquid droplets, pad-printing or the pattern forming method provided by the present invention enables a pattern of semiconductor to be deposited so as to overlie the source and drain electrodes of one field effect transistor, without making electrical contact with the overlying semiconductor layer of an adjacent field effect transistor.

The array of field effect transistors may be fabricated on a common substrate, wherein the insulating layers are each deposited by projection in the form of liquid droplets or by pad-printing. Use of an accurate printing technique, such as projection in the form of liquid droplets, pad-printing or the pattern forming method provided by the present invention, enables an insulating layer to be deposited so as to overlie the source and drain electrodes and semiconducting layer of one field effect transistor only, such that a part of each of the source and drain electrodes is left exposed, and an electrical connection between the drain electrode of one field effect transistor and the gate electrode of an adjacent field effect transistor may be deposited without the need to create via holes or use other destructive processes.

Such well-defined patterns of electronically functional material are also suitable for forming other electronic, magnetic and optical circuits, biochips and micro-electronic mechanical systems.

In this specification, "PEDOT:PSS" means poly(3,4-ethylenedioxythiophene)-polystyrenesulphonic acid; "PMMA" means polymethylmethacrylate; and "P3HT" means poly-3-hexylthiophene.

For a better understanding of the invention and to show how the same may be carried into effect, reference will now be made, by way of example only, to the accompanying drawings, in which like numerals are used throughout, and in which.

Figure 1:
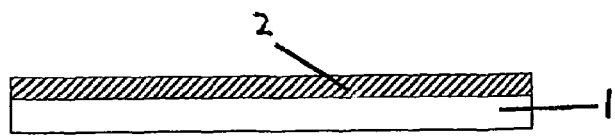
FIG. 1 shows the side view of a substrate according to an embodiment of the invention at a first stage of fabrication.

Referring firstly to FIG. 1, a substrate 1 formed from glass is shown with an overlying layer of S1818 photoresist 2, a product of Shipley UK. A desired pattern is defined by removing parts of the photoresist material 2 by a photolithographic technique, resulting in the pattern illustrated in FIG. 2.

A layer of colloidal particles of PEDOT:PSS 3, having an average diameter of about 100 nm and in a dispersant of water, is projected onto the substrate 1 and photoresist material 2 in the form of liquid droplets having an average size of about 30 µm, by a process often referred to as ink-jet printing, and then subjected to a drying step to consolidate the particles. The resulting layer has a thickness of about 300 nm.

Figure 4:
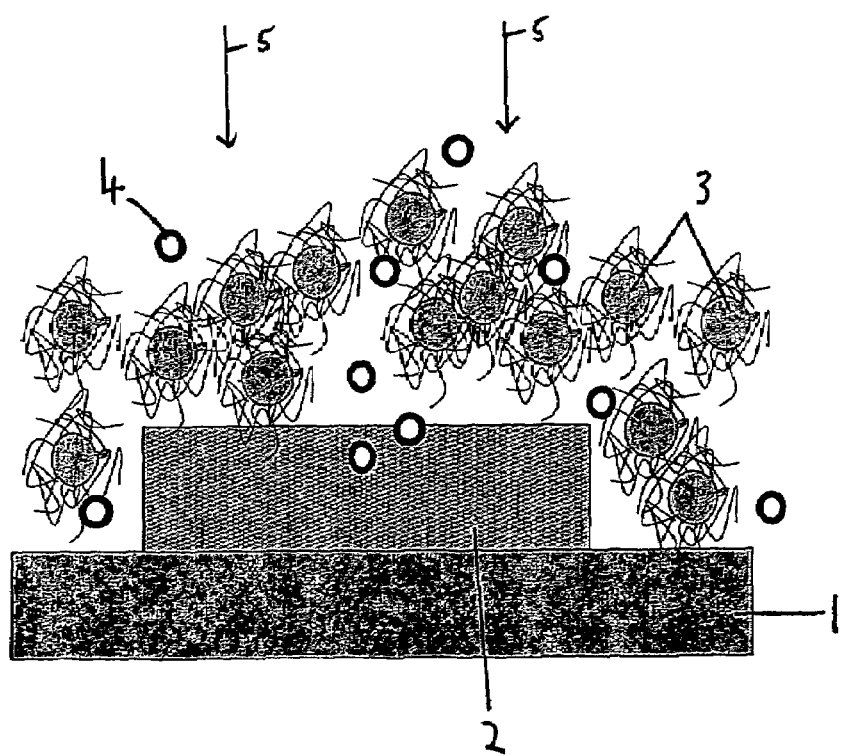
FIG. 4 shows a side view of the substrate shown in FIG. 3 at the third stage of fabrication soaked in acetone.

The layer of consolidated particles of PEDOT:PSS 3 contains a small amount of water. FIG. 4 shows particles of PEDOT:PSS 3 interspersed with water molecules 4. The layer of PEDOT:PSS 3 is then soaked in acetone 5. The presence of water molecules 4 in the layer of PEDOT:PSS 3 ensures a loosely packed; low density morphology. The morphology facilitates the passage of the acetone molecules (not shown) to the photoresist 2. The acetone 5 solubilizes and removes the photoresist 2, as a result of which areas of PEDOT:PSS 3 which directly overlie the photoresist 2 are also removed.

Figure 5:
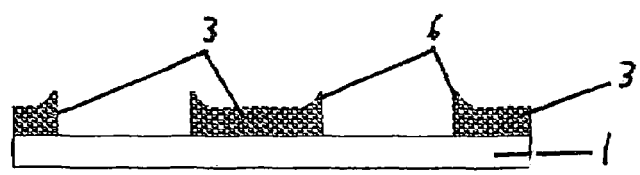
FIG. 5 shows the side view of the substrate of FIG. 1 at a fourth stage of fabrication.
Figure 6:
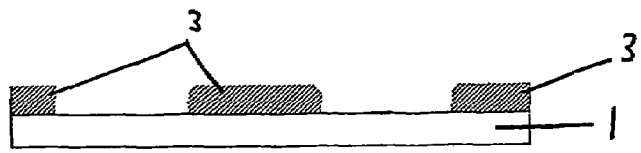
FIG. 6 shows a side view of the substrate of FIG. 1 at a fifth stage of fabrication.

FIG. 5 shows the resultant pattern of PEDOT:PSS 3 on the substrate 1. Removal of the layer of photoresist 2 leaves rough or sharp edges 6 at the extremities of the PEDOT:PSS 3. The PEDOT:PSS 3 is then treated with D-sorbitol dissolved in N-methylpyrrolidone and isopropanol, and afterwards treated with Silquest® in an inert solvent. The edges 6 are then smoothed in an annealing step at 100-200° C. FIG. 6 shows the resultant pattern of PEDOT:PSS 3 after smoothing.

Figure 7:
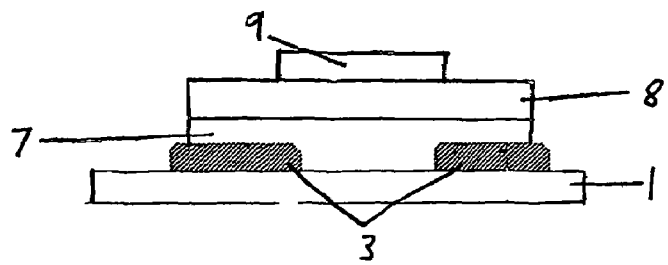
FIG. 7 is a schematic diagram of a field effect transistor fabricated from the substrate of FIG. 1 at the fifth stage of fabrication.

The resultant pattern of PEDOT:PSS 3 constitutes the source and drain electrodes for the fabrication of a field effect transistor. A field effect transistor is shown in FIG. 7, in which a layer of P3HT 7 of thickness 40 nm is deposited by printing over the PEDOT:PSS source and drain electrodes 3 and in electrical contact therebetween. A layer of PMMA 8 of thickness 600 nm is deposited by printing over the layer of P3HT 7, and finally, another layer of PEDOT:PSS 9 of thickness 300 nm is deposited by printing. The layer of P3HT 7 constitutes a semiconductor layer, the layer of PMMA 8 constitutes an insulator layer and the layer of PEDOT:PSS 9 constitutes a gate electrode.

Figure 8:
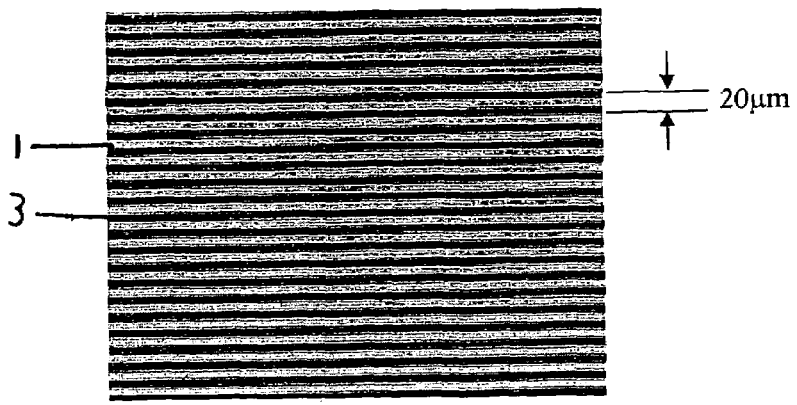
FIG. 8 shows a top view of the substrate with patterned PEDOT:PSS fabricated with the use of photoresist removed by photolithography.

FIG. 8 shows a pattern of PEDOT:PSS fabricated by using the embodiment of the invention in which the patterning material is a photoresist.

Figure 9:
FIGS. 9 and 10 show a top view of typical source-drain electrode structures fabricated according to the present invention.
Figure 10:
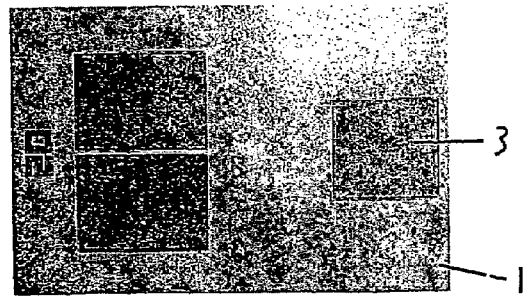

FIGS. 9 and 10 show typical source-drain electrode structures fabricated in accordance with the embodiment of the invention.

Figure 2:
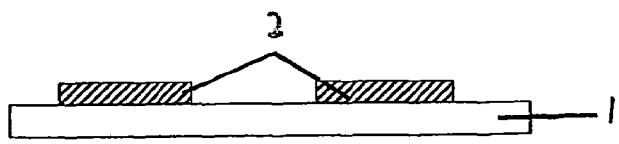
FIG. 2 shows the substrate of FIG. 1 at a second stage of fabrication.
Figure 3:
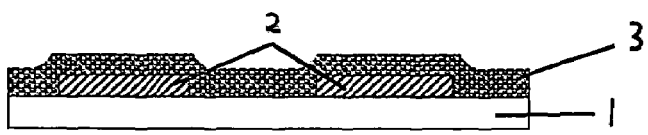
FIG. 3 shows the substrate of FIG. 1 at a third stage of fabrication.

In an alternative embodiment of the invention, the patterning material could be a thermoplastic polymer, such as PMMA, which is then patterned by micro-embossing and has a thickness of 300 nm. A similar structure to that shown in FIG. 2 is achieved in this embodiment except that the layer of photoresist 2 is substituted by a thermoplastic polymer.

Figure 11:
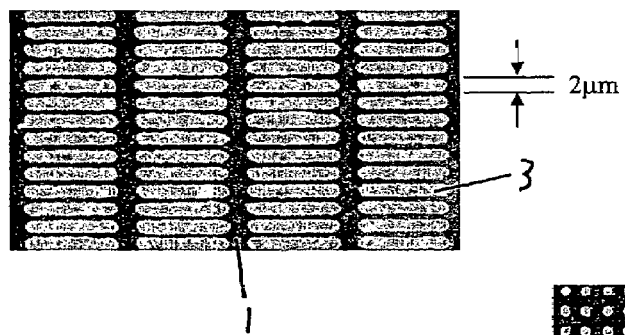
FIG. 11 shows a top view of the substrate with a pattern of PEDOT:PSS fabricated by use of PMMA and micro-embossing according to another embodiment of the invention.
Figure 12:
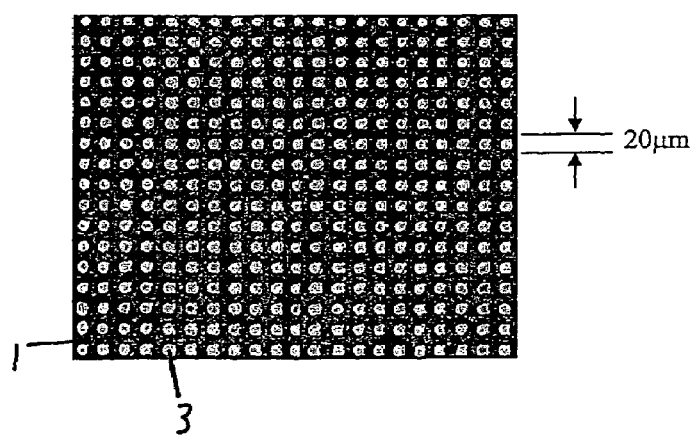
FIG. 12 shows a top view of the substrate with another pattern of PEDOT:PSS fabricated by use of PMMA and micro-embossing according to another embodiment of the invention.

FIGS. 11 and 12 show patterns of PEDOT:PSS 3 fabricated by using a method according to a further embodiment of the invention, in which the patterning material is PMMA, patterned by micro-embossing.

The colloid of electronically functional material in the liquid dispersant may be a colloid of metal, indium titanium oxide, tin oxide, polyaniline, polypyrrole; elemental semiconductors such as silicon, germanium, selenium, carbon nanotubes, $C_{60}$; compound semiconductors such as flakes of a layered transition metal dichalcogenide, gallium arsenide, indium phosphide; small-molecule organic semiconductors such as pentacene particles; organic semiconducting polymer particles; or insulators such as silicon dioxide, mica, latex or dielectric polymer particles.

When the electronically functional material is a metal colloid, a suitable post-patterning treatment is thermal annealing, with results in a large increase in conductivity. When the electronically functional material is polyaniline, a suitable post-patterning treatment is "secondary doping" by treating with m-Cresol, which results in a large increase in conductivity.

Some etchants which have been used in the past to remove polymers during standard photolithographic techniques tend to swell, or even remove, the overlying photoresist layer, thereby causing unwanted damage to the pattern of underlying polymer. Whilst this problem can be overcome by the use of oxygen plasma etching, this technique requires expensive equipment. Use of the patterning method provided by the present invention for patterning polymers, whether insulators, semiconductors or conductors, avoids the need to use such etchants. The types of etchant which may be used to solubilize the photoresist layer, such as acetone, are not so aggressive that they affect the types of polymer suitable for use as a patterning polymer. The need to use an oxygen plasma technique is also avoided.

The methods herein described exhibit advantages of both known approaches of fabricating electronic components. Particle-based "inks" formulated for high performance, preformed electronically functional materials may be deposited by any printing technique on a pre-patterned structure. In the case of ink-jet printing, the projection properties of suspensions comprising particles of electronically functional material are far less important than with known micro-liquid technologies, as highly accurate deposition of the suspension is not required. Furthermore, it is possible to print suitable ink by pad-printing if it should be preferred to ink-jet printing. The methods herein described have high-resolution capability and potential for large area, high volume mass production, both in batch or continuous web processes.

Although methods consistent with the present invention have been described with reference to embodiments thereof, those skilled in the art will appreciate that various changes in form and detail may be made without departing from the present invention as defined in the appended claims.

The invention claimed is:

1. A method of forming a desired pattern of electronically functional material on a substrate comprising the steps of:
   creating a first layer of patterning material on the substrate whilst leaving areas of the substrate exposed to define said desired pattern;
   printing a suspension comprising particles of the electronically functional material in a liquid dispersant, to which the patterning material is impervious, on the patterning material and the exposed substrate;
   removing at least some of the liquid dispersant from the suspension to consolidate the particles; and
   applying a first solvent to said consolidated particles which is capable of solubilizing the patterning material and to which the consolidated particles are pervious so that the patterning material is removed from the substrate together with any overlying electronically functional material.

2. A method according to claim 1, wherein the patterning material is a photoresist and said desired pattern is formed by depositing a layer of the photoresist and subsequently removing selected portions of the photoresist by photolithography to create the first layer.

3. A method according to claim 1, wherein the patterning material is a thermoplastic polymer and said desired pattern is formed by depositing a layer of the thermoplastic polymer and subsequently micro-embossing the layer to create the first layer.

4. A method according to claim 3, wherein the thermoplastic polymer is polymethylmethacrylate.

5. A method according to claim 1, wherein the suspension of the electronically functional material is colloidal.

6. A method according to claim 1, wherein the suspension is printed by projection in the form of liquid droplets.

7. A method according to claim 1, wherein the removal of at least some of the liquid dispersant from the suspension is carried out by drying at room temperature or accelerated drying by heating by thermal contact, by microwave irradiation, by incident infra-red radiation or by subjecting the printed suspension to a lower pressure than atmospheric pressure.

8. A method according to claim 1, wherein the liquid dispersant is water.

9. A method according to claim 1, wherein the first solvent is acetone.

10. A method according to claim 1, wherein the electronically functional material is an insulator.

11. A method according to claim 10, wherein the insulator is silicon dioxide, mica, latex or a dielectric polymer.

12. A method according to claim 1, wherein the electronically functional material is a semiconductor.

13. A method according to claim 12, wherein the semiconductor is carbon nanotubes, flakes of a layered transition metal dichalcogenide, pentacene particles or an organic semiconducting polymer.

14. A method according to claim 13, wherein the organic semiconducting polymer is poly-3-hexylthiophene.

15. A method according to claim 1, wherein the electronically functional material is a conductor.

16. A method according to claim 15, wherein the conductor is a metal, indium tin oxide, tin oxide, a polythiophene, polyaniline or polypyrrole.

17. A method according to claim 16, wherein the polythiophene is poly (3,4-ethylenedioxythiophene)-polystyrenesulphonic acid.

18. A method according to claim 17, further comprising the step of treating the consolidated particles with D-sorbitol dissolved in N-methylpyrrolidone and isopropanol after applying the first solvent.

19. A method according to claim 17, further comprising the step of treating the consolidated particles with a second solvent, containing cross-linking agents, after applying the first solvent.

20. A method according to claim 18, wherein the consolidated particles are annealed so as to smooth the surface thereof after the consolidated particles have been treated.

21. A method of fabricating a field effect transistor comprising the steps of forming a desired pattern of conductor on a substrate according to the method as defined in claims 15, the pattern defining source and drain electrodes, depositing a layer of semiconductor in electrical contact with the source and drain electrodes, depositing a layer of insulator over the layer of semiconductor and providing a gate electrode on the layer of insulator.

22. A method according to claim 21, wherein the layer of semiconductor is deposited by projection in the form of liquid droplets or by pad-printing.

23. A method according to claim 21, wherein the layer of insulator is deposited by projection in the form of liquid droplets or by pad-printing.

24. An array of field effect transistors fabricated on a common substrate, wherein each field effect transistor is fabricated in accordance with the method of claim 21.

25. A method according to claims 21, wherein the gate electrode is deposited by projection in the form of liquid droplets or by pad-printing.

26. A method according to claims 20, wherein the layer of semiconductor is formed from an organic semiconducting polymer.

27. A method according to claim 20, wherein the layer of insulator is formed from polymethylmethacrylate.

28. A method according to claim 20, wherein the gate electrode is formed from poly(3,4-ethylenedioxythiophene)-polystyrenesulphonic acid.

* * * * *